United States Patent [19]

Munnig Schmidt et al.

[11] Patent Number: 4,849,681

[45] Date of Patent: Jul. 18, 1989

[54] BATTERY-POWERED DEVICE

[75] Inventors: Robert H. Munnig Schmidt; Geert J. Bosscha, both of Drachten, Netherlands

[73] Assignee: U.S. Philips Corporation, Tarrytown, N.Y.

[21] Appl. No.: 121,446

[22] Filed: Nov. 16, 1987

[30] Foreign Application Priority Data

Jul. 7, 1987 [NL] Netherlands ............... 8701596

[51] Int. Cl.[4] ............... G08B 21/00; H02J 7/00
[52] U.S. Cl. ............... 320/13; 320/37; 320/48
[58] Field of Search ............ 320/20, 37, 38, 48, 320/43, 39, 40

[56] References Cited

U.S. PATENT DOCUMENTS 4,455,523  6/1984  Koenck ............... 320/43
4,743,831  5/1988  Young ............... 320/48

Primary Examiner—R. J. Hickey
Attorney, Agent, or Firm—Bernard Franzblau

[57] ABSTRACT

In a device where a load ($R_1$) is powered by a battery (6), if a detection means (10) detects a battery voltage below a first threshold value ($V_1$) defined by an adjustable voltage source (20), a first time-measurement means (40, 50) measure the time interval during which the load 6 is powered by the battery (6), at a voltage below the first threshold value. If subsequently, the load is switched off and is not connected to the AC supply voltage via a power-supply circuit (1), the battery is discharged by a discharger (30). Second time-measurement means (40, 60) measure the time interval during which the discharger is operative until the detection means detect a battery voltage below a second threshold value ($V_2$), which is defined by a voltage source (25) and at which the battery may be regarded as fully discharged or drained. After comparison of the sum of the time intervals measured by the first and the second time-measurement means with a reference value, correction means (70) correct the first threshold value in such a way that during a next discharge the time measured is more in agreement with the reference value.

14 Claims, 5 Drawing Sheets

BATTERY-POWERED DEVICE

BACKGROUND OF THE INVENTION

This invention relates to a device comprising:

a load which can be powered by a rechargeable battery;

a power-supply circuit for charging the battery and/or powering the load; and first detection means for detecting a battery voltage substantially equal to a first threshold value.

In the present application "battery" is to be understood to mean a unit comprising one or more cells, such as nickel-cadmium cells.

Such a device is constituted by, for example, a domestic appliance which can be battery-powered or which can be mains-powered by means of a power-supply circuit. The battery can be recharged via the power-supply circuit when the appliance is switched off. In particular, such a device may be constituted by a rechargeable electric shaver.

Such a device is known from European Patent Application No. 110,466, which corresponds to U.S. Pat. No. 4,536,757. In said known device the first detection means are employed for generating a signal which informs the user that the batteries are almost drained and have to be recharged before long. The first threshold value is then selected in such a way that, for example, at least one period of use of approximately five minutes is available after detection of this value. In practice it is found that many users recharge the batteries immediately after the period of use in which the nearly-discharged indication occurs. As a result of this the batteries are never discharged completely. However, in the long run the battery material becomes inert, causing the battery capacity to decrease. As a result of this, the time still available for use after detection of the first threshold value decreases, so that ultimately a full period of use is not available any more. Moreover, the battery capacity also decreases as a result of aging, so that the time still available for use after detection of the first threshold value also decreases. In addition, in the known device the time still available for use depends on the load of the device. A copending U.S. application Ser. No. 121,445 (11/16/87) describes a related battery powered device in which the time still available for use, after a nearly-discharged indication, remains substantially constant.

SUMMARY OF THE INVENTION

Therefore, it is an object of the invention to provide a device in which the available battery capacity after detection of the first threshold value remains substantially constant. To this end a device of the type defined in the opening paragraph is characterized in that the device further comprises:

second detection means for detecting a battery voltage substantially equal to a second threshold value smaller than the first threshold value;

a discharger for discharging the battery with the load switched off after detection of the first threshold value until detection of the second threshold value;

first time-measurement means for measuring the time interval during which the load is powered by the battery after detection of the first threshold value until detection of the second threshold value;

second time-measurement means for measuring the time interval during which the discharging device is operative, and correction means for correcting the first threshold value of the first detection means depending on the weighted sum of the time intervals measured by the first and the second time measurement means relative to a reference value.

Upon detection of the first threshold value in a device in accordance with the invention after the device has been switched off, a discharger circuit discharges the battery to a second threshold value for which the battery may be regarded as fully discharged. Both the time during which the device is still switched on after detection of the first threshold value and the time during which the discharger circuit is operative are measured. The weighted sum of these time intervals is compared with a reference value and depending on the result the first threshold value is raised or reduced in such a way that the battery capacity still available after detection of the first threshold value remains substantially constant. Thus, the user can be certain that after detection of the first threshold value always at least one period of use of, for example, approximately 5 minutes is available.

It is to be noted that U.S. Pat. No. 4,575,669 describes a device for completely discharging the battery in order to keep the battery capacity as large as possible. However, in this device no adaptation of a threshold value of a nearly-discharged indication is effected.

An embodiment of a device in accordance with the invention may be characterized in that the device further comprises:

third detection means for detecting a weighted sum of the time intervals measured by the first and the second time-measurement means, which sum is substantially equal to a third threshold value and for switching off the discharger or the load after detection of said third threshold value. In this embodiment the discharging device is switched off when the second or the third threshold value is detected. The third threshold value corresponds to the desired time of use at the nominal load current below a battery voltage equal to the first threshold value. If the second threshold value is detected before the third threshold value the time of use still available is inadequate and the first threshold value is raised. In the opposite case the first threshold value is reduced.

BRIEF DESCRIPTION OF THE DRAWING;

The invention will now be described in more detail, by way of example, with reference to the accompanying drawings in which.

Figure 1:
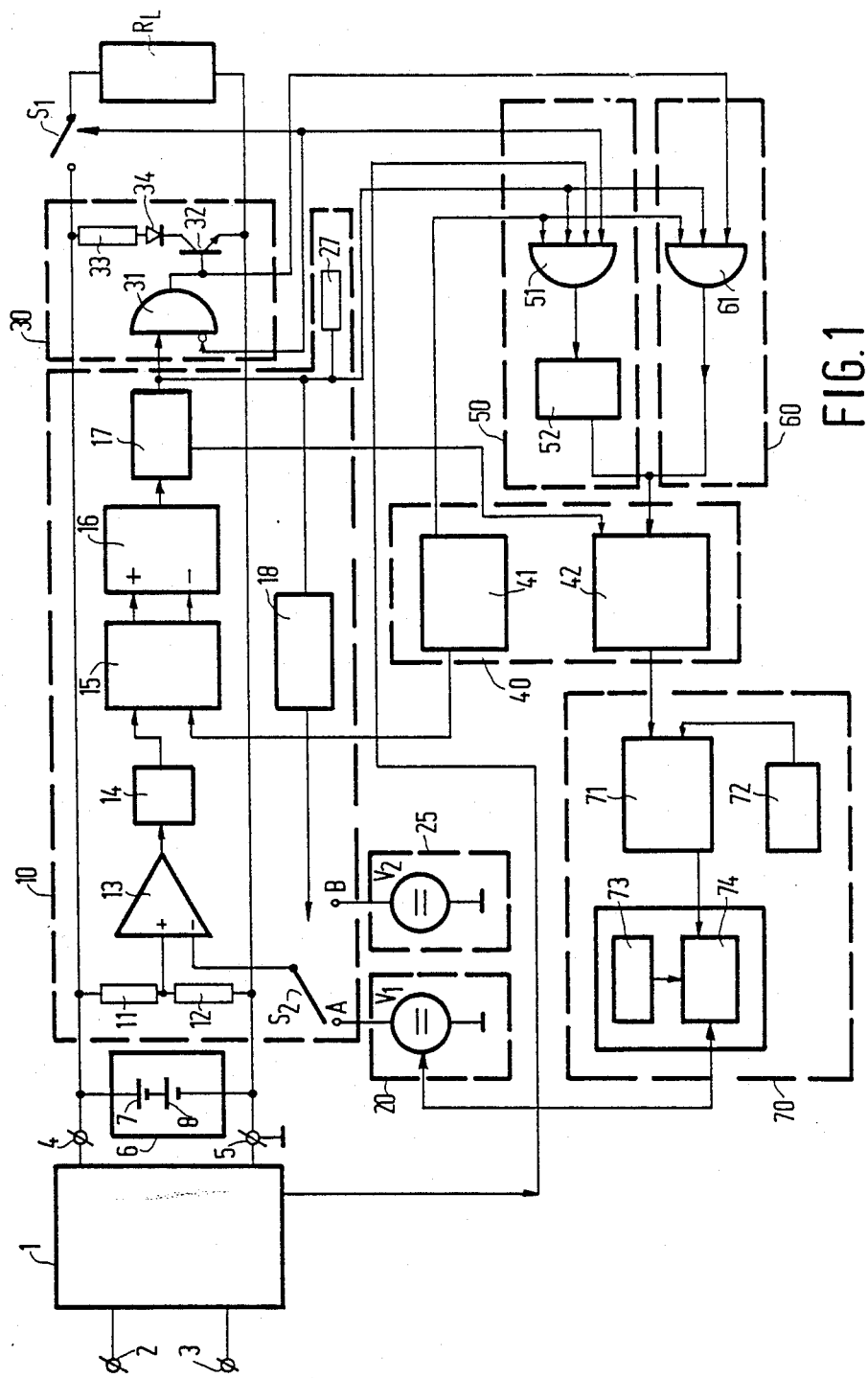
FIG. 1 shows a first embodiment of a device in accordance with the invention.

DESCRIPTION OF THE PREFERRED EMBODIMENTS;

FIG. 1 is the circuit diagram of a first embodiment of a device in accordance with the invention. The device comprises a power-supply circuit 1 having terminals 2 and 3 for connection to a voltage supply, which may be either an alternating voltage or a direct voltage supply The power-supply circuit is, for example, a switched-mode power supply as disclosed in British Patent Specification No. 2,000,394 or European Patent Application No. 30026. The outputs 4 and 5 of the power-supply circuit 1 are connected to a battery 6, which in the present example comprises two series-connected nickel-cadmium cells 7 and 8. By means of a switch $S_1$ a load $R_L$ can be arranged in parallel with the battery 6. This load $R_L$ may be, for example, the motor of an electric shaver.

When the device is connected to the supply voltage and the switch $S_1$ is open the power supply circuit 1 supplies the charging current for the battery 6, which mode is referred to hereinafter as the battery-charging mode. When the device is connected to the supply voltage and the switch $S_1$ is closed the power-supply circuit 1 supplies a current to the load $R_L$ and a comparatively small charging current to the battery 6 if the battery voltage is lower than the value at which the voltage across the load $R_L$ is stabilized by the power-supply circuit 1. Hereinafter, this mode will be referred to as the mains-shaving mode. If the power-supply circuit 1 is not connected to the mains and the switch $S_1$ is closed the current to the load $R_L$ is supplied by the battery 6. This mode will be referred to hereinafter as the battery-shaving mode. It is to be noted that instead of one circuit the power supply circuit may comprise two circuits, one circuit powering the motor in the mains shaving mode and the other circuit charging the batteries in the battery charging mode.

The device further comprises first detection means 10, 20 for detecting a battery voltage below a value $V_1$ determined by an adjustable voltage source 20 and second detection means 10, 25 for detecting a battery voltage below a value $V_2$ defined by the voltage source 25, the part 10 of the circuit being common to the first and the second detection means. This part 10 comprises a voltage divider consisting of the resistors 11 and 12 connected across the battery 6, the junction point of the resistors being connected to the non-inverting input of a comparator 13 whose inverting input is connected to the adjustable voltage source 20 or to the voltage source 25 via a switch $S_2$. The output of the comparator 13 is connected to the input of a Schmitt trigger 14 whose output is connected to one input of a gate circuit 15 whose other input is connected to an output of an oscillator 41. The outputs of the gate circuit 15 are connected to the count-up and count-down inputs of a counter 16 whose output is connected to the input of a binary scaler 17 whose output supplies the output signal of the first and the second detection means and the switching signal for the switch $S_2$, if required, via a delay circuit 18. The output of the binary scaler 17 is further connected to an indicator 27 which, when the voltage at the output of the binary scaler goes high, informs the user that the battery 6 is almost drained and must be recharged before long.

The device also comprises a discharger 30 for discharging the battery 6, which discharger comprises an AND-gate 31 having a non-inverting input to which the output signal of the first and the second detection means is applied and having an inverting input to which a signal is applied which is high if the switch $S_1$ is closed and which is low if this switch is open. The output of the AND-gate 31 is connected to the base of an NPN transistor 32 whose collector-emitter path, in series with a discharging resistor 33 and a light-emitting diode 34, is connected across the battery 6. It is to be noted that, instead of in the collector line, the resistor 33 may alternatively be arranged in the emitter line of the transistor 32. Moreover, the diode 34 may be arranged at other locations in the circuit to indicate that the discharger 30 is operative.

The device further comprises first time measurement means 40, 50 for measuring the time interval during which the load is powered by the battery 6 and second time-measurement means 40, 60 for measuring the time interval during which the discharger circuit 30 is in operation, in both cases after the first detection means 10, 20 have detected a battery voltage below the voltage $V_1$ and until the second detection means 10, 25 detect a battery voltage below the value $V_2$.

The first time-measurement means 40, 50 comprise an AND-gate 51 having four inputs which respectively receive the output signal of an oscillator 41, the output sigal of the first and the second detection means, a signal which is high if the power-supply circuit 1 is not connected to the mains voltage and low if the circuit is connected to the mains voltage, and a signal which is high if the switch $S_1$ is closed and low if the switch $S_1$ is open. The output of the AND-gate 51 is connected to a counter 42 via a scaler 52. The second time-measurement means 40, 60 comprise an AND-gate 61 having three inputs which respectively receive the output signal of the oscillator 41, the output signal of the first and the second detection means, and the output of the AND-gate 31.

The device further comprises correction means 70, comprising a comparator 71 for comparing, upon detection of a battery voltage below the value $V_2$ by the second detection means 10, 25, the count of the counter 42, with a reference voltage stored in a memory 72. The correction means 70 further comprise a read-only memory 73, which stores a value which defines the nominal value $V_1$ of the voltage source 20 and a read-write memory 74 into which the nominal value from the read-only memory 73 is loaded when the device is put into operation for the first time and after every replacement of the battery 6. After every discharge this value is corrected depending on the output signal of the comparator 71 and then determines the value $V_1$ of the voltage source 20.

The operation of the device can be explained as follows. It is assumed that the device is in the battery-shaving mode, in which the switch $S_1$ is closed and the power-supply circuit 1 is not connected to the mains voltage. Further, it is assumed that the battery voltage exceeds the value $V_1$ defined by the voltage source 20, the switch $S_2$ being consequently in position A. In this situation the voltage at the output of the comparator 13 and the voltage at the output of the Schmitt trigger 14 are high. The pulses from the oscillator 41 are then applied to the count-down input of the counter 16, so that the count remains zero as long as the battery voltage remains higher than the voltage $V_1$ of the voltage source 20. The output of the counter 16 is then low, so that the output of the binary scaler 17 is also low. The AND-gate 31 is then closed and the discharger 30 is consequently inoperative. The AND-gates 51 and 61 are then also closed, so that the count of the counter 42 remains zero.

If the battery voltage decreases below the value $V_1$, the voltage on the output of the comparator 13 and that on the output of the Schmitt trigger 14 go from high to low. The pulses from the oscillator 41 are then applied to the count-up input of the counter 16. After, for example, five seconds this counter 16 reaches a count at which the output voltage changes from low to high. If within this time interval the battery voltage again exceeds the voltage $V_1$, the counter 16 counts down to zero and the output voltage of the counter remains low. This ensures that the first detection means do not detect brief decreases below the voltage $V_1$ caused by peak loads as below-level conditions. If the output of the counter 16 goes high, the voltage on the output of the scaler 17 also goes high and the indicator 27 is driven. The switch $S_2$ is set to position B via the delay circuit, so that the voltage source 25 is then connected to the inverting input of the comparator 13. The outputs of the comparator 13 and the Schmitt trigger 14 then go high again and the output of the counter 16 thus goes low. However, as a result of the presence of the binary scaler 17 the voltage on the output of this circuit remains high. The AND-gate 31 then remains closed because the switch $S_1$ is closed. However, the AND-gate 51 is opened so that pulses are applied from the oscillator 40 to the counter 42 via the scaler 52. In this way the first time measurement means 40, 50 measure the time interval during which the load $R_L$ is powered by the battery 6 after detection of a battery voltage below the voltage $V_1$.

If, the device is switched off in that the switch $S_1$ is opened, the supply of pulses to the counter 42 via the AND-gate 51 ceases. However, when the switch $S_1$ is opened the AND-gate 31 opens, so that the voltage on the base of the transistor becomes high, causing this transistor to be turned on. As a result of this, the battery 6 is discharged, which is indicated by the LED 34. The discharging current is then limited by the resistor 33. When the discharger circuit 30 is switched on the AND-gate 61 is opened, so that now pulses are applied from the oscillator 41 to the counter 42 via said gate. Since these pulses are not applied to the counter 42 via a scaler but directly, the on-time of the discharger circuit 30 is multiplied directly by a factor which is equal to the ratio between the discharging current and the nominal shaving current. The count of the counter 42 then directly equals the weighted sum of the time intervals measured by the first and the second time measurement means. The discharging current is, for example, three times the nominal shaving current in the battery shaving mode. In that case the scaler 52 is a scale-of-three circuit. However, it is alternatively possible to connect a counter to each of the gates 51 and 61 and to determine the weighted sum of the counts of these counters.

If the apparatus is switched on intermediately, for example because the user wishes to continue shaving, the discharger circuit 30 is switched off and the AND-gate 61 is closed. However, the AND-gate 51 is then opened again, so that this shaving time is also measured.

If the battery voltage decreases below the value $V_2$ defined by the voltage source 25, the voltage on the output of the comparator 13 and that of the trigger 14 again goes from high to low, so that if this condition persists for, for example, five seconds the voltage on the output of the counter 16 goes low again.

The output of the binary scaler 17 then also goes low, so that the AND-gate 31 is closed and the discharger circuit 30 is switched off. As a result of this, the AND-gate 61 is also closed, so that the supply of oscillator pulses to the counter 42 ceases. The count of this counter 42 is a measure of the battery capacity still available below the battery voltage $V_1$ or, in other words, it is a measure of the shaving time still available until the battery voltage $V_2$ is reached. This time is now selected in such a way that upon detection of a battery voltage equal to $V_1$ at least one shaving period of, for example, five minutes is available. A value corresponding to this time interval is stored in the memory 72. Upon detection of the battery voltage below the value $V_2$ the count of the counter 42 is transferred to the comparator 71 under command of a pulse obtained from the binary scaler 17, which comparator compares this count with the reference value from the memory 72. If the value is smaller than the reference value the value stored in the read-write memory 74 is increased, causing the voltage $V_1$ of the source 20 to be increased. If the value is larger than the reference value the voltage $V_1$ is reduced. The adaptation of the voltage $V_1$ may be incremental or proportional to the difference between the count of the counter 42 and the value stored in the memory 72. In this way the voltage $V_1$ is adapted after every discharge in such a way that during a subsequent discharge below the battery voltage $V_1$ a certain battery capacity, and hence a certain shaving time, remains available. Moreover, since upon each discharge the battery 6 is discharged completely, the battery capacity remains up to standard.

If the apparatus is switched off and the battery voltage has decreased below the value $V_1$, i.e. if the discharger circuit is operative, and the user connects the power-supply circuit 1 to the mains voltage in order to recharge the battery 6, the power-supply circuit 1 will have to be rendered inoperative depending on the charging current supplied by the power-supply circuit.

If the power-supply circuit 1 is of the type which in a comparatively long time, for example 8 hours, fully charges the battery 6 with a current which is small relative to the discharging current of the circuit 30, the power-supply circuit will not significantly influence the operation of the remainder of the circuit and need not be rendered inoperative. If the power-supply circuit is of the type which in a comparatively short time, for example, 1 hour, charges the battery with a comparatively large current, the power-supply circuit 1 must be rendered inoperative. This can be achieved very simply, for example, by means of the output signal of the AND-gate 31, which is high if the discharger circuit 30 is operative and low if this circuit is inoperative.

Figure 2:
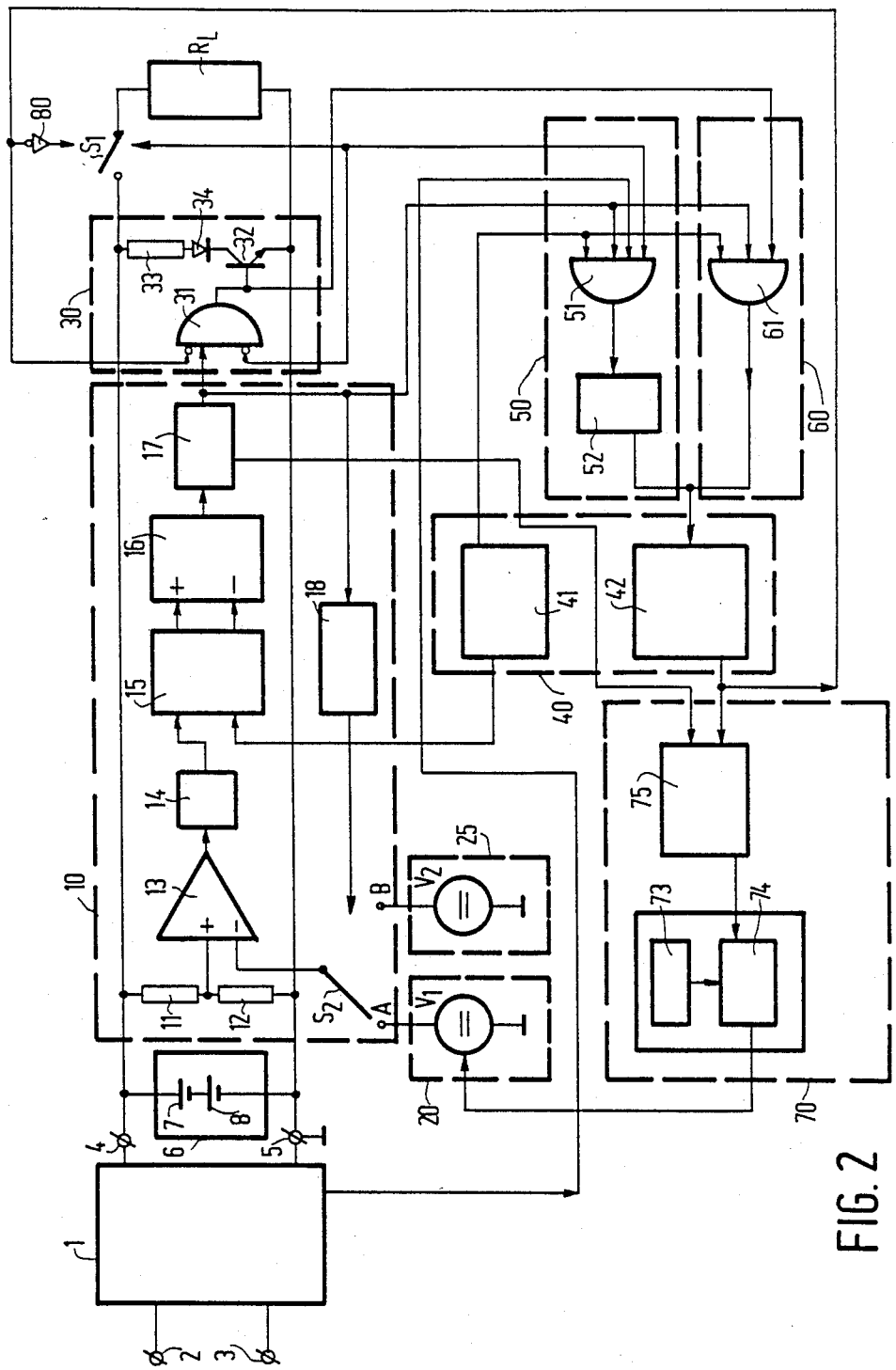
FIG. 2 shows a second embodiment of a device in accordance with the invention.

FIG. 2 shows a second embodiment of a device which is particularly suitable for apparatuses comprising a power-supply circuit with a quick-charge facility. If the power-supply circuit 1 is connected to the mains voltage and the battery voltage is lower than $V_1$ volts, the battery 6 in such an apparatus is charged with a comparatively large current in a comparatively short time, for example 3 minutes, so that at least one period of use of, for example, 5 minutes is available within a short time. If such apparatuses are provided with a device as shown in FIG. 1, however, and the battery voltage is lower than $V_1$ volts, the discharger circuit 30 will be rendered operative and the power-supply circuit 1 will be disabled. If complete discharging of the battery takes, for example, three minutes no shaving time is available three minutes after connection to the mains voltage, in contradistinction to what the user expects. This undesired situation is avoided when the device shown in FIG. 2 is employed. In this FIG. identical parts bear the same reference numerals as in FIG. 1. However, the counter 42 is now a counter having a maximum count corresponding to a time interval of, for example, three minutes. When the discharger circuit is operative the maximum count is reached after 1 minute if the discharging current is three times the nominal shaving current As long as this maximum count is not yet reached the voltage on the counter output is comparatively low. This output is connected to an inverting input of the AND-gate 31 and, via an inverter 80, to the switch $S_1$. In the battery-shaving mode the switch $S_1$ remains closed and after switching-off, the discharger circuit 30 remains operative until the maximum count is reached. When the maximum count is reached the voltage on the output of the counter 42 becomes comparatively high and, depending on the mode of operation, the switch $S_1$ is opened or the discharger circuit 30 is switched off.

The output signal of the counter 42 and the signal derived by means of the binary scaler 17, which becomes high if the battery voltage decreases below the value $V_2$, is applied to a gate circuit 75. If the maximum count is reached before the battery voltage has decreased below the voltage $V_2$, the residual shaving time below the battery voltage $V_1$ is longer than the shaving time corresponding to the maximum count. The circuit 75 then supplies a signal causing the value stored in the memory 74 to be reduced so that the voltage $V_1$ is reduced. If the battery voltage decreases below the value $V_2$ before the maximum count is reached, the residual shaving time below the battery voltage $V_1$ is smaller than the shaving time corresponding to the maximum count. In that case the circuit 75 supplies a signal causing the value in the memory 74 to be increased so that the voltage $V_1$ is increased.

In this way the system will control itself in such a way that below the battery voltage $V_1$ a residual shaving time of, in the present example, substantially three minutes is always available. Since the discharger circuit is operative for a maximum of 1 minute, the power-supply circuit 1 is disabled only for a maximum time of 1 minute. After the usual "quick charging" time of three minutes in the present example, the available shaving time will generally be adequate for one shave.

Figure 3:
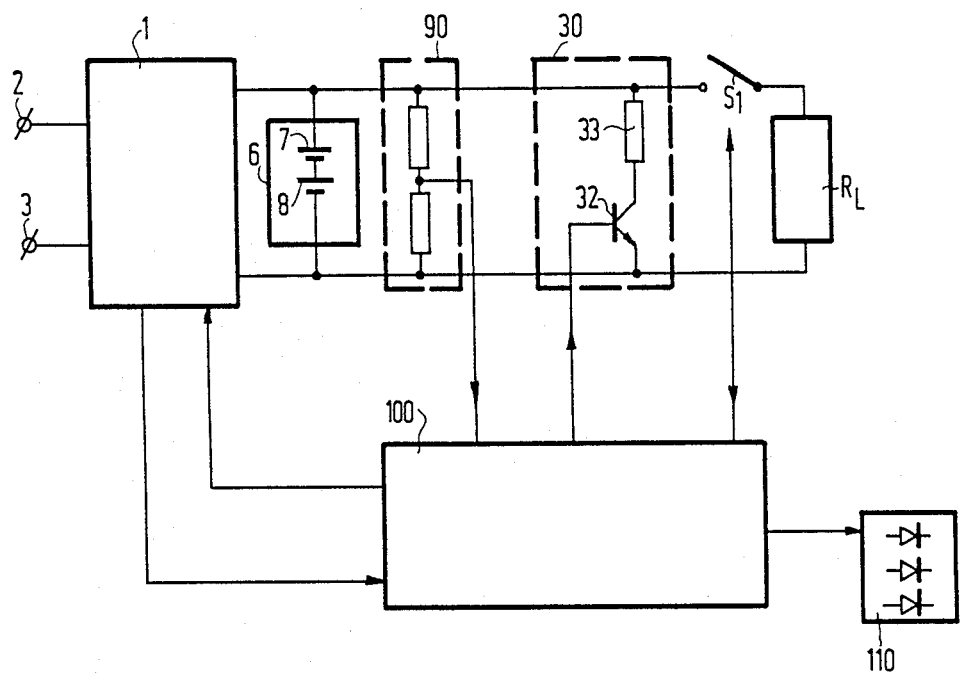
FIG. 3 shows a third embodiment of a device in accordance with the invention.

The functions of the first and second detection means, the first and second time measurement means, and the correction means described with reference to FIGS. 1 and 2 can be realized advantageously by means of a microprocessor. FIG. 3 is the block diagram of a device provided with such a microprocessor. The device again comprises a power supply-circuit 1 having mains voltage terminals 2 and 3, a battery 6 and a load $R_L$ which can be connected in parallel with the battery 6 by means of the switch $S_1$. The device further comprises a voltage detector 90, a discharger 30, a microprocessor 100, and a plurality of indicator elements shown schematically in block 110 for indicating the various conditions. The microprocessor 100 receives a signal which indicates whether the power-supply circuit 1 is connected to the mains and a signal which indicates whether the load $R_L$ is connected. In addition, the battery voltage information from the voltage detector 90 is applied to the microprocessor 100. The microprocessor controls the discharger 30, the power-supply circuit 1 and the indicator block 110 depending on this information.

Figure 4:
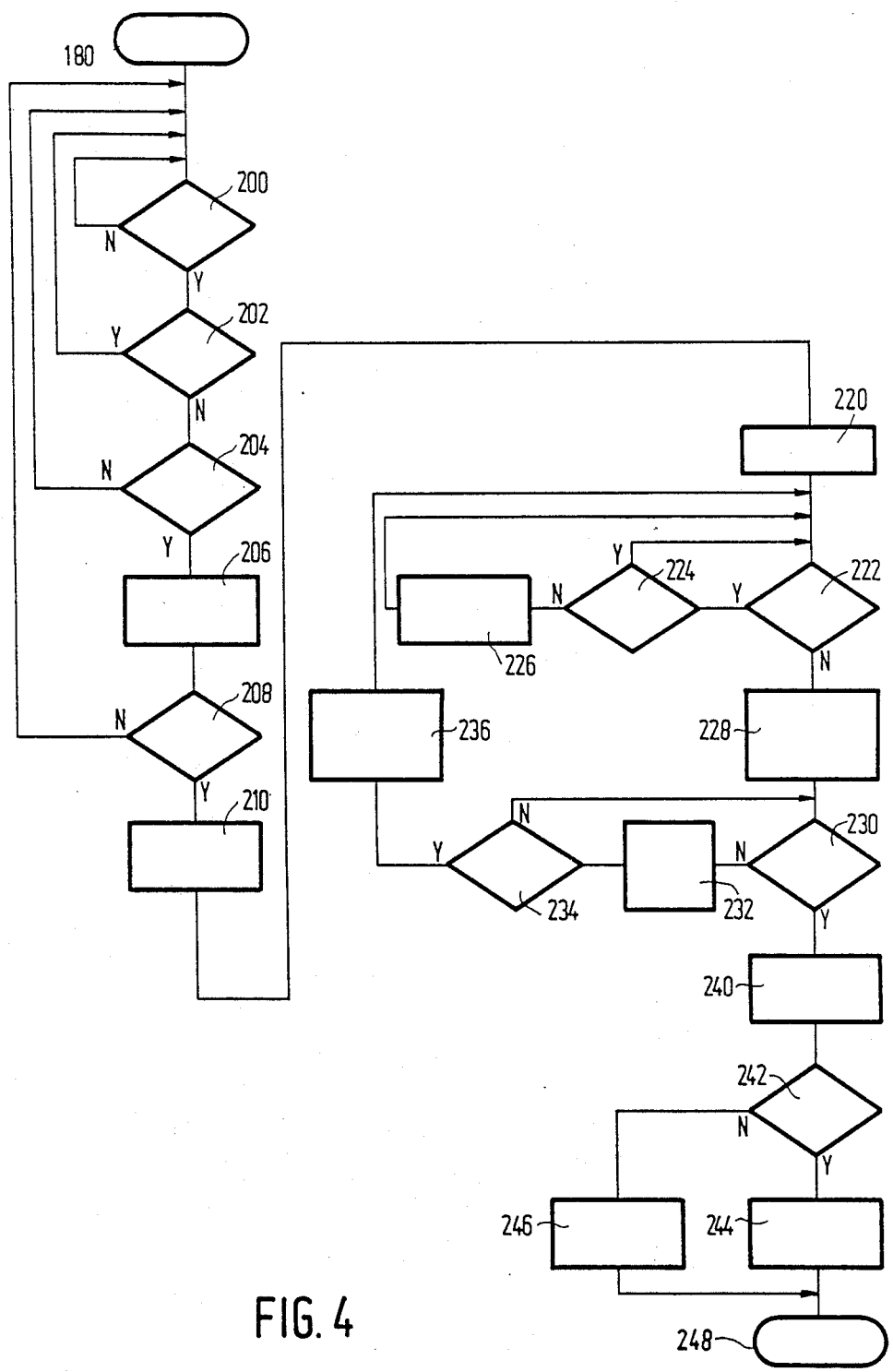
FIG. 4 is a flow chart of the program of the microprocessor shown in FIG. 3 in the case where the device of FIG. 3 operates in the same way as that of FIG. 1.

FIG. 4 is the flow chart of the program performed by the microprocessor in the case where the operation of the device corresponds to that of FIG. 1. This program may be described as follows.

In block 200, designated "motor on", it is first ascertained whether the switch $S_1$ is closed and whether the load is connected. Subsequently, in block 202, designated "mains on", it is ascertained whether the power-supply circuit 1 is connected to the mains voltage. If it is connected to the mains, the mains-shaving mode occurs and the program returns to the beginning. As long as the mains-shaving mode occurs this loop is followed. If the power-supply circuit is not connected to the mains voltage the battery-shaving mode occurs. In block 204, designated "$V_b < V_1$", it is then detected on the basis of the voltage information from the voltage detector 90 whether the battery voltage $V_b$ is smaller than a first reference voltage $V_1$. As long as this is not the case the preceding program is repeated each time. If the battery voltage $V_b$ is smaller than $V_1$, the average value of the battery voltage is determined in block 206 designated "digital filter", and subsequently in block 208, designated "$V_b < V_1 > 5$ sec" it is detected whether the average battery voltage remains below the reference voltage $V_1$ for a time longer than for example 5 seconds. If this is not the case the program jumps back to the beginning and the loop is executed again. If the battery voltage remains below the reference level, a LED of the block 110 in FIG. 3 is driven in block 210, designated "BLI-LED on", to indicate to the user that the battery 6 is nearly drained and must be recharged. Subsequently, in block 220, designated "t,$t_1$, $t_2 = 0$", the time t, the value of the shaving time $t_1$ stored in a memory, and the value of the discharging time $t_2$ stored in a memory are reset to zero. After this, in block 222, designated "motor on" it is detected whether the motor is on, after which in block 224, designated "mains on", it is ascertained whether the power-supply circuit is connected to the mains voltage. If the motor is on, but is not energized by the mains voltage, i.e. in the battery-shaving mode, the count is incremented by one after every execution of the loop in block 226, designated "t→t+1", so that the time is measured during which the motor is powered by the battery. In block 228, designated "discharge on; t→$t_1$; t=$t_2$", if the motor is switched off in the battery shaving mode, the discharger circuit is switched on, the power-supply circuit is switched off if necessary, an indicator, if present, which briefly after switching off indicates that the battery must be recharged is switched on, and, if present, a LED which indicates that the discharging device is operative is switched on. The time during which the motor has operated below the battery voltage $V_1$ is loaded into the memory as the time $t_1$ and the time t is set to the value $t_2$ stored in the memory, which value is zero in the present example because the discharger circuit 30 has not been operative previously. In block 230, designated "$V_b < V_2$" it is subsequently detected whether the battery voltage has decreased below the value $V_2$. If this is not the case, the time is increased in block 232, designated "t→t+1", and subsequently in block 234, designated "motor on" it is detected whether the motor is not switched on. As long as the motor is not switched on again, the time is measured during which the discharger circuit is operative. If the motor is switched on again, because the user wishes to continue shaving, in block 236, designated "discharge-off; t→t$_2$, t=t$_1$", the discharger circuit and the discharge LED, if present, are switched off, the power-supply circuit is switched on if it is off, the time interval t$_2$ during which the discharging circuit has been operative is loaded into the memory, and the time is set to the value t$_1$ stored in the memory. Subsequently, the program returns to block 222 to follow the loop for measuring the time during which the motor has been on, which time is added to the time t$_1$ during which the motor has been on in the battery-shaving mode. If subsequently the motor is switched off again, the discharger circuit is switched on again and the time during which it is operative is measured again and is added to the time t$_2$ during which the discharging circuit has already been operative. If in block 230 it is detected that the battery voltage has decreased below the value V$_2$, then in block 240, designated "t$_{tot}$=t$_1$+cxt$_2$", the discharger circuit is switched off, the power-supply circuit is turned on, and the weighted sum is determined of the time intervals during which, below the battery voltage V$_1$, the battery is discharged by the motor and the discharging circuit, the weighting factor C being equal to the ratio between the discharging current and the nominal shaving current. Consequently, the time t$_{tot}$ indicates the nominal shaving time still available below the battery voltage V$_1$ until the voltage V$_2$ is reached. Subsequently, in block 242, designated "t$_{tot}$<t$_s$", it is ascertained whether the total time t$_{tot}$ is smaller than a reference value t$_s$. If the time t$_{tot}$ is smaller the voltage V$_1$ is increased incrementally or proportionally in block 244, designated "V$_1$→V$_1$+x", so that during the next discharge after detection of the battery voltage V$_1$ a longer shaving time is available until the battery voltage V$_2$ is reached. If the time t$_{tot}$ is longer, the voltage V$_1$ is reduced in block 246, designated "V$_1$→V$_1$−x", so that upon the next discharge after detection of the voltage V$_1$ a shorter shaving time is available until the battery voltage V$_2$ is reached.

Figure 5:
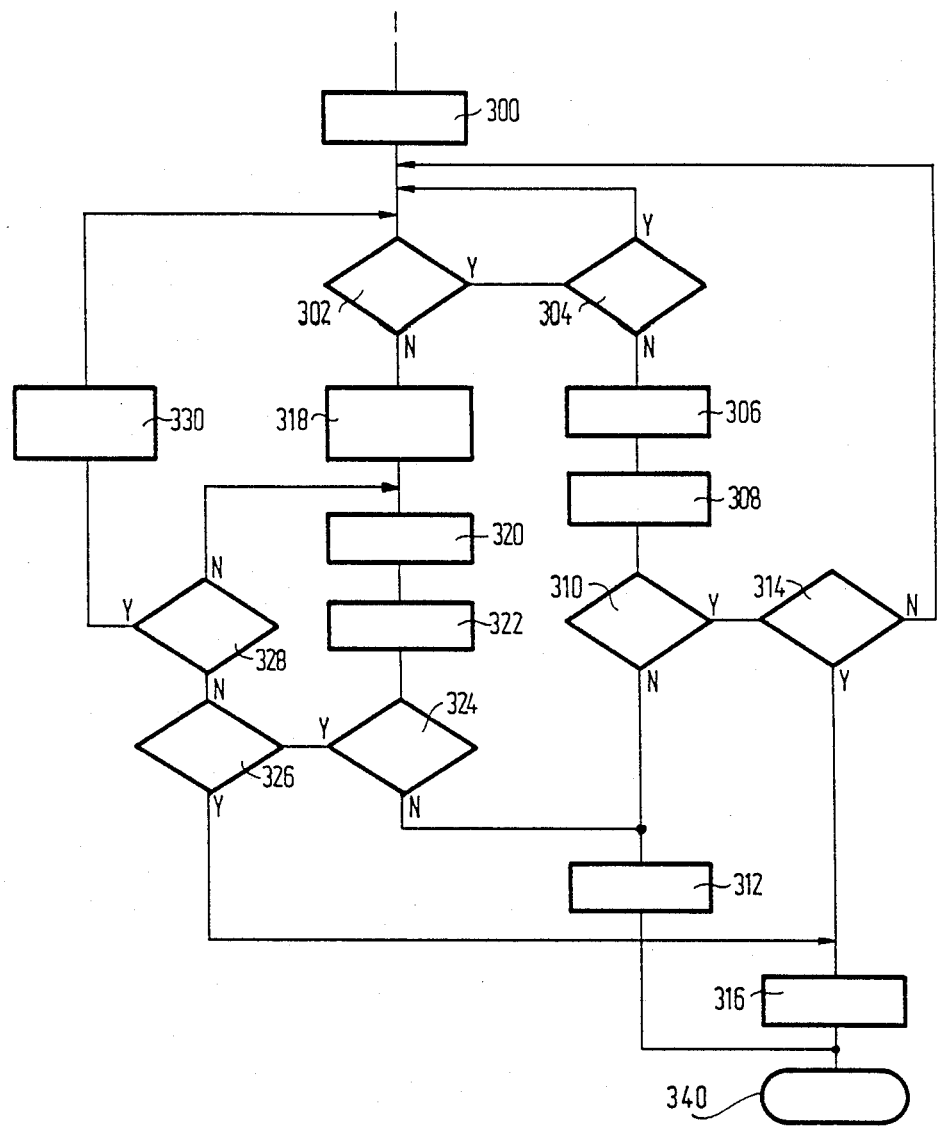
FIG. 5 is a flow chart of the program of the microprocessor shown in FIG. 3 in the case where the device operates in the same way as that shown in FIG. 2.

FIG. 5 is the flow chart of the program performed by the microprocessor in the case where the operation of the device corresponds to that of FIG. 2, the maximum discharging time of the battery being, for example, 1 minute. The first part of the program up to block 210 is identical to that in FIG. 4. In this part it is determined whether in the battery-shaving mode the battery voltage has decreased below the value V$_1$. If this is the case the program is continued in block 300, designated "t,t$_1$, t$_2$, t$_{tot}$=0", in which the time intervals measured are reset to zero. Subsequently, in block 302, designated "motor on", it is detected whether the motor is on and, if it is on, it is ascertained in block 304, designated "mains on" whether the mains-shaving or battery-shaving mode occurs. During mains shaving the program each time returns to block 302. In the battery-shaving mode the time during which the motor is on is measured. In block 306, designated "t=t+1" the count is each time incremented by one and subsequently, in block 308, designated "t$_{tot}$=t$_1$+c. t$_2$" the weighted sum is determined of the time interval during which the motor has been operative and the time interval during which the discharging circuit has already been operative, the weighting factor being equal to the ratio between the discharging current and the nominal shaving current. Subsequently, in block 310, designated "t$_{tot}$<t$_s$" it is detected whether this total time is smaller than a reference value t$_s$. If t$_{tot}$>t$_s$ the motor is switched off and the voltage V$_1$ is reduced in block 312, designated "V$_1$→V$_1$−x", so that during the next discharge upon detection of a battery voltage equal to the voltage V$_1$ a shorter shaving time is available, which is in better in agreement with the reference value t$_s$. If the time t$_{tot}$<t$_s$ 2 it is subsequently detected in block 314, designated "V$_b$<V$_2$", whether the battery voltage V$_b$ has decreased below the value V$_2$. If this is not the case the program returns to block 302 and the loop is executed again to measure the time during which the motor is operative in the battery-shaving mode. If the battery voltage has decreased below the voltage V$_2$, the motor is switched off and the voltage V$_1$ is increased in block 316, designated "V$_1$→V$_1$+x", so that in the next discharge after detection of the voltage V$_1$ a longer shaving time is available.

If in the battery shaving mode the motor is switched off, which is detected in block 302, the time t$_1$ during which the motor has been operative is loaded into the memory and the time t is set to the value t$_2$ during which the discharger circuit has already been operative, which is effected in block 318, designated "discharger on, t→t$_1$, t=t$_2$". Subsequently, in block 320, designated "t→t+1" the time is incremented by one unit and in block 322, designated "t$_{tot}$=t$_1$+c. t$_2$, the weighted sum of the time intervals t$_1$ and t$_2$ is determined, the weighting factor c again being equal to the ratio between the discharging current and the nominal shaving current If, in block 324, designated "t$_{tot}$<t$_s$" it is detected that this weighted sum t$_{tot}$ is larger than a reference value, the discharge circuit is switched off and the voltage V$_1$ is reduced in block 312, designated "V$_1$→V$_1$−x". During the next discharge, upon detection of a battery voltage equal to the voltage V$_1$, the available shaving time will be shorter. If t$_{tot}$<t$_s$ it is detected in block 326, designated "V$_b$<V$_2$", whether the battery voltage has decreased below the value V$_2$. Should this be the case, the voltage V$_1$ is increased in block 316, so that upon a subsequent discharge more shaving time is available after detection of a battery voltage equal to V$_1$. As long as the battery voltage is higher than the voltage V$_2$ and the motor is not switched on again, which is detected in block 328, designated "motor on", the time interval during which the discharger circuit is operative is measured. If the motor is switched on again, then in block 330, designated "discharger off, t→t$_2$, t=t$_1$", the discharger circuit is switched off, and is enabled if necessary, the discharge time t$_2$ is loaded into the memory and the time t is set to the value t$_1$, after which the program is repeated starting at block 302.

The invention is not limited to the embodiments described herein. Within the scope of the invention many variants are conceivable to those skilled in the art. For example, the first and the second detection means, the first and the second time measurement means, and the correction means may be constructed in other ways than shown.

What is claimed is:
1. A device comprising:
    a rechargeable battery connectable to a load for energizing said load,
    a power-supply circuit for charging the battery and/or energizing the load,
    first detection means for detecting a battery voltage substantially equal to a first voltage threshold value and with the battery connected to the load, a discharger for discharging the battery when the battery is subsequently disconnected from the load, second detection means for detecting a battery voltage substantially equal to a second voltage threshold value lower than the first threshold value, first time-measurement means for measuring a first time interval during which the battery is connected to the load after detection of the first threshold value and within a time period between detection of the first and second threshold values, second time-measurement means for measuring a second time interval during which the battery is disconnected from the load and the discharger is operative and within the time period between detection of the first threshold value and detection of the second threshold value, and correction means for correcting the first threshold value depending on a weighted sum of said first time interval and said second time interval as measured by the first and the second time-measurement means and relative to a reference value.

2. A device as claimed in claim 1, further comprising third detection means for detecting a weighted sum of the time intervals measured by the first and the second time-measurement means, which sum is substantially equal to a third threshold value and, means for switching off the discharger or the load after detection of said third threshold value.

3. A device as claimed in claim 1 or 2, further comprising means for switching off the power-supply circuit when the discharger circuit is operative.

4. A device as claimed in claim 2, where the discharger comprises series arrangement of a resistor and a transistor switch, said series arrangement being connected in parallel with the battery.

5. A device as claimed in claim 4, further comprising light-emitting diode connected in series with the resistor.

6. A device as claimed in claim 1 further comprising means for switching off the power supply circuit when the discharger circuit is operative.

7. A device as claimed in claim 1 wherein the discharger comprises a series arrangement of a resistor and a transistor switch, said series arrangement being connected in parallel with the battery.

8. A battery powered device comprising:

switching means for selectively connecting a rechargeable battery to a load, first means for coupling the rechargeable battery to a power supply circuit for charging the battery, second means including said switching means for coupling the load to the power supply circuit for energizing the load from said power supply circuit, first detection means for detecting, with the switching means closed, a battery voltage substantially equal to a first voltage threshold value, a discharge circuit coupled to the battery to discharge the battery when said switching means is opened, second detection means for detecting a battery voltage substantially equal to a second voltage threshold value lower than the first voltage threshold value, first time-measurement means for measuring a first time interval during which the battery is connected to the load after detection of the first threshold value and within a time period between detection of the first and second threshold values, second time-measurement means for measuring a second time interval during which the battery is disconnected from the load and the discharge circuit is operative and within the time period between detection of the first threshold value and detection of the second threshold value, and correction means for correcting the first threshold value depending on a weighted sum of said first time interval and said second time interval as measured by the first and the second time-measurement means and relative to a reference value.

9. A device as claimed in claim 8, wherein said correction means comprises:

a counter, an oscillator, a first gate circuit responsive to said switching means for coupling said oscillator to a count input of the counter during said first time interval, a second gate circuit responsive to the state of the discharge circuit for coupling said oscillator to said counter count input during said second time interval, and a comparison device for comparing an output of the counter with a reference value indicative of a desired available battery capacity.

10. A device as claimed in claim 8, wherein said first and second voltage threshold values are derived from an adjustable DC voltage source and a fixed DC voltage source, respectively, and wherein the second voltage threshold value represents a voltage level at which said rechargeable battery is substantially fully discharged and said first voltage threshold value represents a given voltage differential related to said reference value.

11. A device as claimed in claim 8, wherein said correction means includes means for adjusting the first voltage threshold value so as to provide a substantially constant available battery capacity after detection of said first voltage threshold value during the life of the rechargeable battery.

12. A device as claimed in claim 1, wherein said first voltage threshold value is derived from an adjustable DC voltage source and the second voltage threshold value represents a voltage level at which said rechargeable battery is substantially fully discharged, wherein said reference value represents a given time interval for operation of the load starting from detection of the first voltage threshold value, and wherein said correction means adjusts the adjustable DC voltage source thereby to correct said first voltage threshold value so as to maintain said given time interval substantially constant.

13. A method of operating a rechargeable battery and a load from a power supply circuit, which method comprises:

detecting a battery voltage substantially equal to a first voltage threshold value, detecting a battery voltage substantially equal to a second voltage threshold value lower than the first voltage threshold value and which defines a given time interval between said first and second voltage threshold values, measuring a first time interval within said given time interval and starting with detection of said first voltage threshold value and during which the battery is connected to the load, measuring a second time interval within said given time interval during which the battery is disconnected from the load and is being discharged via a battery discharge circuit, deriving a weighted sum of the first and second time intervals, and adjusting the first voltage threshold value in response to a derived weighted sum.

14. A dry-shaving apparatus comprising:

a motor, and a device comprising:

a rechargeable battery connectable to the motor for energizing said motor, a power-supply circuit for charging the battery and/or energizing the motor, a first detection means for detecting a battery voltage substantially equal to a first voltage threshold value and with the battery connected to the motor, a discharger for discharging the battery when the battery is subsequently disconnected from the motor, second detection means for detecting a battery voltage substantially equal to a second voltage threshold value lower than the first threshold value, first time-measurement means for measuring a first time interval during which the battery is connected to the motor after detection of the first threshold value and within a time period between detection of the first and second threshold values, second time-measurement means for measuring a second time interval during which the battery is disconnected from the motor and the discharger is operative and within the time period between detection of the first threshold value and detection of the second threshold value, and correction means for correcting the first threshold value depending on a weighted sum of said first time interval and said second time interval as measured by the first and the second time-measurement means and relative to a reference value.

* * * * *